(12) United States Patent
Tachikawa et al.

(10) Patent No.: US 7,914,976 B2
(45) Date of Patent: Mar. 29, 2011

(54) PRODUCTION METHOD FOR ELECTROLUMINESCENT ELEMENT

(75) Inventors: Tomoyuki Tachikawa, Tokyo (JP); Norihito Ito, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 12/420,163

(22) Filed: Apr. 8, 2009

(65) Prior Publication Data

US 2009/0191486 A1 Jul. 30, 2009

Related U.S. Application Data (62) Division of application No. 10/513,954, filed as application No. PCT/JP03/05786 on May 8, 2003, now Pat. No. 7,534,557.

(30) Foreign Application Priority Data

May 9, 2002 (JP) ................................. 2002-134000

(51) Int. Cl.
C09K 6/00 (2006.01)
H01J 9/227 (2006.01)

(52) U.S. Cl. .......................... 430/321; 430/319; 445/24

(58) Field of Classification Search .................. None
See application file for complete search history.

(56) References Cited

U.S. PATENT DOCUMENTS

| 6,617,186 B2 * | 9/2003 | Kashiwabara | 438/29 |
| 7,147,992 B2 * | 12/2006 | Itou et al. | 430/321 |
| 7,534,557 B2 * | 5/2009 | Tachikawa et al. | 430/321 |

FOREIGN PATENT DOCUMENTS

| JP | 58-068930 A | * | 4/1983 |
| JP | 3-064758 A | * | 3/1991 |
| JP | 10-261486 A | | 9/1998 |
| JP | 10-335068 A | | 12/1998 |
| KR | 2002-0024553 A | * | 3/2002 |

OTHER PUBLICATIONS

Computer-generated translation of KR 2002-0024553 A (Mar. 2002).*

* cited by examiner

*Primary Examiner* — John A. McPherson
(74) *Attorney, Agent, or Firm* — Ladas & Parry LLP

(57) ABSTRACT

The present invention provides a method for manufacturing an EL element including an organic EL layer forming process of forming an organic EL layer on a substrate, on which at least an electrode layer is formed; a peeling layer forming process of forming a peeling layer on the organic EL layer; a photoresist layer forming process of forming a photoresist layer on the peeling layer, a photoresist layer patterning process of patterning the photoresist layer by exposing and developing; an organic EL layer developing process of removing the organic EL layer of a part not covered with the photoresist layer; and a peeling layer peeling process of removing the photoresist layer laminated thereon by peeling off the peeling layer.

6 Claims, 3 Drawing Sheets

PRODUCTION METHOD FOR ELECTROLUMINESCENT ELEMENT

TECHNOLOGICAL FIELD

The present invention relates to a method for manufacturing an electroluminescent (hereinafter it may be abbreviated as EL) element by a photolithography method, capable of easily peeling unnecessary layer such as a photoresist layer.

BACKGROUND ART

In an EL element, positive holes and electrons injected from counter electrodes are coupled in a light emitting layer, and fluorescent substances in the light emitting layer are excited by the energy so as to emit light of a color corresponding to the fluorescent substances. Thus, attracts an attention as a spontaneous light emitting planar display element. In particular, an organic thin film EL display, using an organic substance as a light emitting material, has high light emitting efficiency which realizes a light emission with a high brightness with a less than 10 V applied voltage, and it is capable of emitting a light by a simple element structure. Thus, application thereof to the advertisement for displaying a specific pattern by light emission and other inexpensive simple displays is expected.

In manufacturing of the display using the EL element, in general, a first electrode layer and an organic EL layer are patterned. As the method for patterning the EL element, a method of deposition of the light emitting material via a shadow mask, a method of printing by an ink jet, a method of destroying a specific light emitting dye by an ultraviolet ray irradiation, screen printing or the like can be presented. However, by these methods, it has been impossible to provide a method for manufacturing an EL element, capable of realizing all of a high light emitting efficiency, a high light taking out efficiency, manufacturing process simplicity, and a high-definition pattern formation.

As a means for solving these problems, a method for manufacturing an EL element by patterning an organic EL layer by a photolithography method has been proposed. In this method, comparing with the conventionally carried out patterning method by the vapor deposition, since vacuum equipments comprising a highly accurate alignment mechanism or the like are not needed, manufacturing can be carried out relatively easily and inexpensively. In contrast, comparing with the patterning method using the ink jet method, it is preferable in that a structure for aiding patterning or a pretreatment to a substrate is not carried out. Furthermore, from the relationship with the discharging accuracy of an ink jet head, the method for manufacturing by the photolithography method is considered as a method more preferable for the high-definition pattern formation, and thus it is advantageous.

FIGS. 3A to 3M show a method for manufacturing an EL element having a plurality of light emitting layers by the photolithography method with these advantages. Hereinafter, FIGS. 3A to 3M will be explained.

Figure 3A:
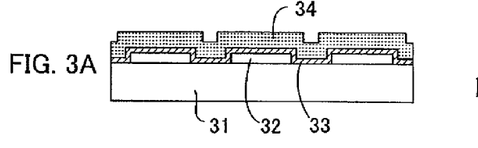
FIGS. 3A to 3M are a process diagrams showing an example of a conventional method for manufacturing an EL element.

First, as shown in FIG. 3A, a first light emitting layer 33 is formed by coating a first light emitting layer forming coating solution onto a substrate 31 having a first electrode layer 32 formed in a pattern. And further, a positive type photoresist layer 34 is formed on the first light emitting layer 33.

Figure 3B:
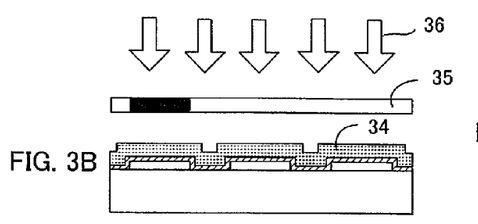
Figure 3C:
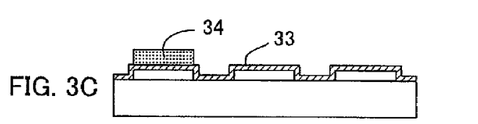

Next, as shown in FIG. 3B, by irradiating an ultraviolet ray 36 via a mask 35 such that only the position where the first light emitting part is formed will be a light shielding part, developing with a photoresist developing agent, and cleaning, as shown in FIG. 3C, the photoresist layer 34 remains only in the position where the first light emitting part will be formed.

Figure 3D:
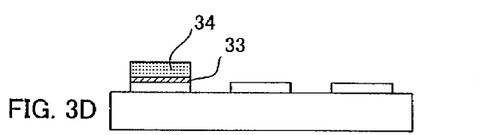

Furthermore, by etching with the photoresist layer 34 formed in a pattern as a mask, as shown in FIG. 3D, the first light emitting layer 33 is etched in a pattern so as to form a first light emitting part 33'.

Figure 3E:
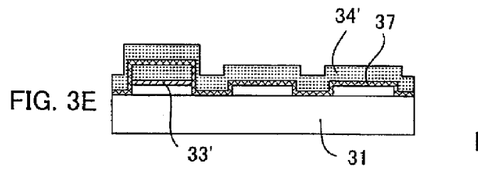

Next, a light emitting layer of a second color is patterned. First, as shown in FIG. 3E, a second light emitting layer forming coating solution is coated onto the substrate 31 having the first light emitting part 33' formed in a pattern so as to form a second light emitting layer 37. Further, by coating a positive type photoresist onto the second light emitting layer 37, a second photoresist layer 34' is formed.

Figure 3F:
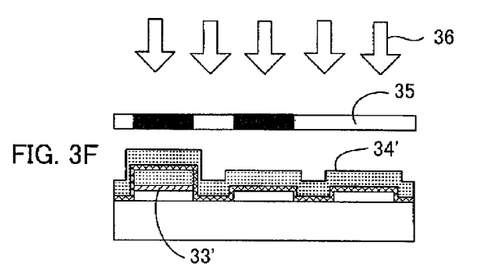
Figure 3G:
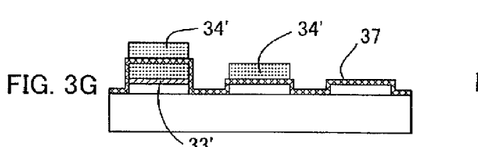

As shown in FIG. 3F, the ultraviolet ray 36 is irradiated in a pattern to the second photoresist layer 34' via the mask 35 such that the position where the first light emitting part 33' is formed and the position where the second light emitting part will be formed will be an unexposed part. Thereafter, by developing with the photoresist developing agent, and cleaning, as shown in FIG. 3G, the second photoresist layer 34' of the exposed part is removed so as to have the second photoresist layer 34' remaining only in the position where the first light emitting part 33' and the second light emitting part are formed.

Figure 3H:
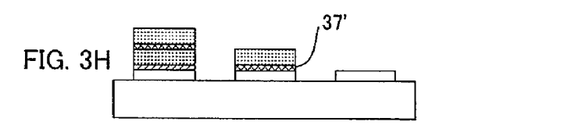

Furthermore, by etching a part of the second light emitting layer 37, which is exposed by removing the second photoresist layer 34' of the exposed part, as shown in FIG. 3H, the second light emitting layer 37 is etched in a pattern so as to form the second light emitting part 37'.

Figure 3I:
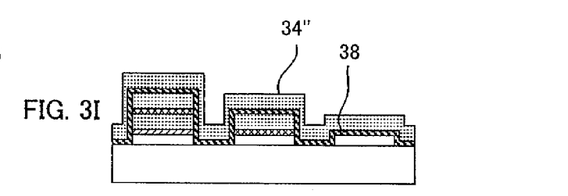
Figure 3J:
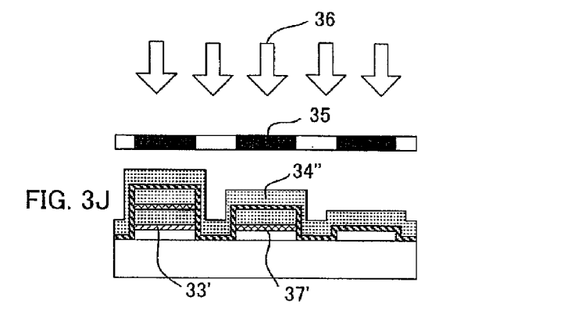

Furthermore, a light emitting layer of a third color is patterned. As shown in FIG. 3I, by coating a third light emitting layer forming coating solution, a third light emitting layer 38 is formed. And by coating a positive type photoresist on the entire surface thereof, a third photoresist layer 34" is formed. Next, as shown in FIG. 3J, with masking the first light emitting part 33', the second light emitting part 37', and the parts where the third light emitting part will be formed by the photomask 35, the ultraviolet ray 36 is exposed in a pattern.

Figure 3K:
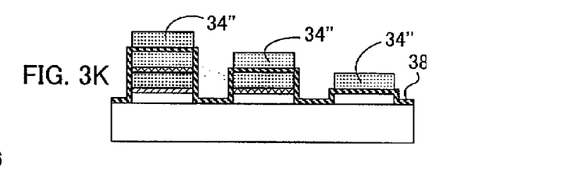

By developing the same with a photoresist developing agent and cleaning, as shown in FIG. 3K, the third photoresist layer 34" is formed in a pattern.

Figure 3L:
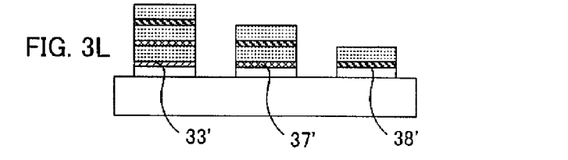

Next, by etching the third light emitting layer 38, which is exposed by removing the exposed part of the third photoresist layer 34", as shown in FIG. 3L, the third light emitting layer 38 is formed in a pattern so as to obtain a third light emitting part 38'.

Figure 3M:
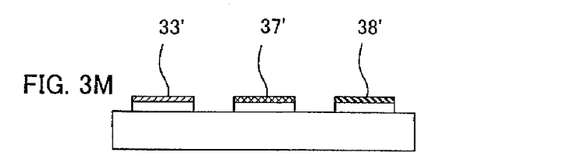

Thereafter, by peeling off the unnecessary layers such as the photoresist layer laminated on each light emitting part 33', 37' and 38' or the like, as shown in FIG. 3M, the patterned light emitting parts 33', 37' and 38' can be obtained.

Thereafter, by forming a second electrode layer or the like on the light emitting parts 33', 37' and 38', an EL element which emits the light to the downward direction in the figure can be manufactured.

However, even in the case of the photolithography method having the advantages, at the time of completing patterning of the light emitting layer and peeling off the photoresist layer, a problem may be involved in that the peeling operation cannot be carried out easily. This derives from a difficulty in selecting the photoresist peeling solution for peeling off the photoresist layer, because the solvent is limited to that satisfies the condition wherein the organic EL layer is not soluble and the photoresist layer is soluble. Also, when the contacting area of the photoresist peeling solution and the photoresist layer is small, it is difficult to exert the function of the photoresist peeling solution to the photoresist layer.

Therefore, in order to solve these problems, a method of exposing the substrate or the like to the photoresist peeling solutions for a long time or the like has been proposed. However, even when the method is employed, it is difficult to peel the photoresist layer off preferably. Moreover, in contrast, a new problem of damaging the substrate or the like is generated.

DISCLOSURE OF THE INVENTION

The present invention has been achieved in view of the abovementioned problems, and the main object there of is to provide a method for manufacturing an EL element, capable of preferably carrying out the peeling operation at the time of peeling off an unnecessary layer such as a photoresist layer.

In order to achieve the object, the present invention provides a method for manufacturing an EL element comprising: an organic EL layer forming process of forming an organic EL layer on a substrate, on which at least an electrode layer is formed; a peeling layer forming process of forming a peeling layer on the organic EL layer; a photoresist layer forming process of forming a photoresist layer on the peeling layer; a photoresist layer patterning process of patterning the photoresist layer by exposing and developing; an organic EL layer developing process of removing the organic EL layer of a part not covered with the photoresist layer; and a peeling layer peeling process of removing the photoresist layer laminated thereon by peeling off the peeling layer.

In the present invention, since the peeling layer having the excellent peeling property is provided on the organic EL layer, the peeling layer can be peeled off easily in the peeling layer peeling process. And thus, the other layers disposed on the peeling layer can be removed with the peeling layer easily at the same time. Therefore, the unnecessary layers such as the photoresist layer, which have hardly been peeled off conventionally, can be peeled off easily.

In the above mentioned invention, it is preferable that the peeling layer is insoluble to the photoresist layer forming solvent, and a material insoluble to the peeling layer forming solvent is used for the organic EL layer. Thereby, the layers to be laminated can be formed without mixing with each other.

Moreover, in the above mentioned invention, it is preferable that the peeling layer is insoluble to a photoresist developing agent used for developing the photoresist layer. Since the peeling layer is not patterned together with the photoresist layer, at the time of the photoresist layer patterning process, the organic EL layer disposed below the peeling layer can be avoided from contacting with the photoresist developing agent. Therefore, at the time of selecting the organic EL layer material, material selection is widened because there is no need to take the above mentioned point into consideration.

In the above mentioned invention, it is preferable that the peeling layer is soluble to the photoresist developing agent used for developing the photoresist layer, and the organic EL layer is insoluble to the photoresist developing agent. At the time of patterning the photoresist layer, the peeling layer can also be developed by the photoresist developing agent at the same time with the photoresist layer. And a trouble of swelling and eluting of the organic EL layer by the photoresist developing agent at the time can be avoided.

In the above mentioned invention, it is preferable that a film thickness of the peeling layer is in a range of 0.05 μm to 5 μm. Since the peeling layer, which is peeled off by bringing into contact with the peeling layer peeling solution has the film thickness within the above mentioned range, the contacting area with the peeling layer peeling solution can be ensured sufficiently so that the peeling layer can be peeled off quickly.

In the above mentioned invention, it is preferable that the organic EL layer is a light emitting layer. The reason for this is, in the EL element, the light emitting layer is an essential layer, and furthermore, a high-definition pattern can be obtained.

Moreover, in the above mentioned invention, it is preferable that the organic EL layer developing process is a process of using a dry etching method. By using the dry etching method, since the substrate or the like needs not to be soaked in the solution or the like in the organic EL layer forming process, damage of the substrate or the like by the solution can be prevented.

BEST MODE FOR CARRYING OUT THE INVENTION

Hereinafter, the method for manufacturing an EL element in the present invention will be explained.

I. Method for Manufacturing an EL Element

A method for manufacturing an EL element in the present invention comprises: an organic EL layer forming process of forming an organic EL layer on a substrate, on which at least an electrode layer is formed; a peeling layer forming process of forming a peeling layer on the organic EL layer; a photoresist layer forming process of forming a photoresist layer on the peeling layer; a photoresist layer patterning process of patterning the photoresist layer by exposing and developing; an organic EL layer developing process of removing the organic EL layer of a part not covered with the photoresist layer; and a peeling layer peeling process of removing the photoresist layer laminated thereon by peeling off the peeling layer.

Here, the "peeling layer" in the present invention means a layer having a high solubility to the peeling layer peeling solution for peeling the peeling layer, and thus, having the excellent peeling property.

In the present invention, by providing the peeling layer on the organic EL layer, the peeling layer can be peeled off easily in the peeling layer peeling process. Therefore, at the time of peeling off the peeling layer, since the other layers formed on the peeling layer, such as the photoresist layer and the like, can be peeled off at the same time, the photoresist layer peeling operation, which has conventionally been difficult, can be carried out easy.

The method for manufacturing an EL element of the present invention having these advantages will be explained in detail for each process.

A. Organic EL Layer Forming Process

The organic EL layer forming process in the present invention is a process of forming an organic EL layer by coating an organic EL layer forming coating solution onto a substrate on which at least an electrode layer is formed.

Hereinafter, the organic EL layer comprising the process will be explained.

(Organic EL Layer)

As the organic EL layer in the present invention, specifically, at least a light emitting layer needs to be included. Additionally, a buffer layer, a positive hole transporting layer, a positive hole injecting layer, an electron transporting layer, an electron injecting layer or the like can be used in a combination.

Moreover, the organic EL layer, to be patterned in the organic EL layer developing process to be described later, may be any one of the layers constituting the above mentioned organic EL layer. In the present invention, it is preferably a light emitting layer or a buffer layer. In particular, a light emitting layer patterned as the organic EL layer is preferable in terms of providing the effect of the present invention maximally. Furthermore, the light emitting layer and the buffer layer can be patterned as the organic EL layer in terms of the light emitting property.

Hereinafter, the light emitting layer and the buffer layer will be explained as the specific embodiments of the organic EL layer in the present invention.

(1) Light Emitting Layer

First, the light emitting layer, which is an essential layer of the organic EL layer, will be explained.

The light emitting layer is formed by coating the light emitting layer coating solution. The light emitting layer forming coating solution, in general, is prepared with a light emitting material, a solvent, and additives such as a doping agent.

Moreover, in the present invention, since the peeling layer is formed on the light emitting layer, it is preferable that each material constituting the light emitting layer is insoluble to the peeling layer forming solvent. Furthermore, in the present invention, it is preferable that, when the peeling layer is patterned with the photoresist layer in the photoresist layer patterning process to be described later, the materials constituting the light emitting layer are insoluble to the photoresist developing agent since the photoresist developing agent and the light emitting layer will be brought into contact.

When a full-color EL element is manufactured, since light emitting layers of a plurality of colors are formed, light emitting layer forming coating solutions of a plurality of kinds are generally used. Hereinafter, each material of the light emitting layer forming coating solution for forming the light emitting layer will be explained.

1. Light Emitting Material

As the materials for forming the light emitting layer to be used in the present invention, for example, the following can be presented.

1) Dye Based Material

As the dye based material, a cyclopendamine derivative, a tetraphenyl butadiene derivative, a triphenyl amine derivative, an oxadiazol derivative, a pyrazoloquinoline derivative, a distylyl benzene derivative, a distylyl arylene derivative, a sylol derivative, a thiophene ring compound, a pyridine ring compound, a pelynone derivative, a pelylene derivative, an oligothiophene derivative, a trifumanyl amine derivative, an oxadiazol dimmer, a pyrazoline dimmer or the like can be presented.

2) Metal Complex Based Material

As the metal complex based material, a metal complex having an Al, a Zn, a Be or the like, or a rare earth metal such as a Tb, an Eu, a Dy or the like as the central metal, and an oxadiazol, a thiadiazol, a phenyl pyridine, a phenyl benzoimidazol, a quinoline structure or the like as the ligand or the like, such as an aluminum quinolinol complex, a benzoquinolinol beryllium complex, a benzoxazol zinc complex, a benzothiazol zinc complex, an azomethyl zinc complex, a porphyline zinc complex, an europium complex or the like can be presented.

3) Polymer Based Material

As the polymer based material, a polyparaphenylene vinylene derivative, a polythiophene derivative, a polyparaphenylene derivative, a polysilane derivative, a polyacetylene derivative or the like, a polyfluolene derivative, a polyvinyl carbazol derivative, a plastid, and metal complex based light emitting material or the like can be presented.

In the present invention, from the viewpoint of utilizing the advantage of high-definition formation of the light emitting part using the light emitting layer coating solution by the photolithography method, it is preferable to use the polymer based material as the light emitting material.

2. Doping Material

Doping can be carried out for the purpose of improving the light emitting efficiency in the light emitting layer, changing the light emitting wavelength or the like. As the doping material, for example, a perylene derivative, a coumarine derivative, a rubrene derivative, a quinacrydone derivative, a squarium derivative, a porphylene derivative, a styryl based dye, a tetracene derivative, a pyrazoline derivative, a decacyclene, a phenoxazone or the like can be presented.

3. Light Emitting Layer Forming Solvent

When used with the buffer layer to be described later, it is preferable that the light emitting layer forming solvent dose not dissolve the buffer layer to prevent mixture or dissolution of the materials constituting the buffer layer and the light emitting layer, at the time of forming the light emitting layer, and to maintain the light emitting property inherent to the light emitting material.

From these viewpoints, as the light emitting layer forming solvent, it is preferable to select a solvent having a solubility of the buffer layer material at 25° C. and 1 atmospheric pressure of 0.001 (g/g solvent) or less, and it is further preferable to select a solvent having a solubility of 0.0001 (g/g solvent) or less.

Furthermore, it is preferable that the solvent for the light emitting layer forming coating solution does not dissolve the photoresist to prevent mixture or dissolution of the materials constituting the photoresist layer and the light emitting layer, at the time of forming the light emitting layers of the second and subsequent colors in the case of coating the light emitting layers of a plurality of layers, and to protect the light emitting layer already patterned.

From these viewpoints, as the light emitting layer forming solvent, it is preferable to select a solvent having a solubility of the photoresist at 25° C. and 1 atmospheric pressure of 0.001 (g/g solvent) or less, and it is further preferable to select a solvent having a solubility of 0.0001 (g/g solvent) or less. For example, when the buffer layer is soluble to a polarity solvent of water based, DMF, DMSO, alcohol or the like, and the photoresist is a common novolak based positive resist: aromatic based solvents such as isomers of a benzene, a toluene and a xylene, and a mixture thereof, isomers of a mesitylene, a tetralin, a p-simene, acumene, an ethyl benzene, a diethyl benzene, a butyl benzene, a chloro benzene, and a dichloro benzene, a mixture thereof and the like; ether based solvents such as an anisol, a phenetol, a butyl phenyl ether, a tetrahydrofuran, a 2-butanone, a 1,4-dioxane, a diethyl ether, a diisopropyl ether, a diphenyl ether, a dibenzyl ether, a digrime and the like; chloro based solvents such as a dichloro methane, a 1,1-dichloro ethane, a 1,2-dichloro ethane, a trichloro ethylene, a tetrachloro ethylene, a chloroform, a carbon tetrachloride, a 1-chloro naphthalene and the like; a cyclo hexanone and the like can be presented. A solvent other than the above can also be used as long as it satisfies the conditions, and a solvent mixture of two or more kinds can be used as well.

(2) Buffer Layer

Next, the buffer layer will be explained.

The buffer layer in the present invention is a layer containing an organic substance, in particular, an organic conductive pair or the like, provided in between an anode and a light emitting layer or a cathode and a light emitting layer so as to facilitate injection of the charge into the light emitting layer. For example, it can be provided as a conductive polymer having a function of improving the positive hole injection efficiency to the light emitting layer and a function to flatten convex-concave of the electrode or the like.

When the conductivity of the buffer layer used in the present invention is high, it is preferable that it is patterned so as to maintain the element diode property, and to prevent cross talk. Therefore, it is preferable that it is formed by patterning according to the present invention. When the resistance of the buffer layer is high or the like, it is not necessary to be patterned in some cases. Moreover, in the case of an element capable of omitting the buffer layer, the buffer layer is not necessary to be provided in some cases.

In the present invention, when both of the buffer layer and the light emitting layer are formed by patterning as the organic EL layer by the photolithography method, as a material forming the buffer layer, it is preferable to select a material which is insoluble to the photoresist layer forming solvent and the solvent used for the light emitting layer formation.

As the material forming the buffer layer used in the present invention, specifically: polymers of a positive hole transporting substance such as a polyalkyl thiophene derivative, a polyaniline derivative and a triphenyl amine; sol-gel films of an inorganic oxide; polymer films of an organic substance such as a trifluoro methane; organic compound films containing a Lewis acid or the like can be presented. However, it is not particularly limited to the above as long as it satisfies the conditions concerning the solubility, and it may satisfy the conditions by reaction, polymerization, calcination or the like after the film formation.

Moreover, in the present invention, as the solvent used at the time of forming the buffer layer, one having the buffer material dispersed or dissolved can be used, and it is not particularly limited. However, when a plurality of times of formation of the buffer layer is needed in full color patterning or the like, it is necessary to use a buffer layer solvent which dose not dissolve the photoresist material, and it is further preferable to use a buffer layer solvent which dose not dissolve the light emitting layer. As the buffer layer solvent usable in the present invention, it is preferable to select a solvent having a solubility of the resist material at 25° C., and 1 atmospheric pressure of 0.001 (g/g solvent) or less, and it is further preferable to select a solvent having a solubility of 0.0001 (g/g solvent) or less. Moreover, as the buffer layer solvent, it is further preferable to select a solvent having a solubility of the light emitting material at 25° C. and 1 atmospheric pressure of 0.001 (g/g solvent) or less, and it is particularly preferable to select a solvent having a solubility of 0.0001 (g/g solvent) or less.

For example, solvents such as: water; alcohols such as a methanol and an ethanol; and a dimethyl formamide, a dimethyl acetamide, a dimethyl sulfoxide, and an N-methyl-2-pyrrolidone can be presented. Other solvents capable of satisfying the conditions can be used as well. Moreover, a mixture of two or more kinds of solvents can be used as well.

B. Peeling Layer Forming Process

Next, the peeling layer forming process will be explained.

The peeling layer forming process in the present invention is a process of forming a peeling layer on the organic EL layer by coating the peeling layer forming coating solution and drying.

As mentioned above, the "peeling layer" in the present invention means a layer having a high solubility to the peeling layer peeling solution used for peeling the peeling layer, and thus, having the excellent peeling property.

The present invention is characterized in that the peeling layer is provided on the organic EL layer. Thereby, the unnecessary layers can be removed easily in the process of removing the unnecessary layers such as the photoresist layer which is carried out after patterning the organic EL layer. As a result, the photoresist layer or the like can be peeled off in a preferable state. Therefore, damage of the substrate or the like, which may conventionally be generated due to the influence of the treatment when peeling off the photoresist layer, can be avoided so that it is advantageous in that the yield can be improved.

Hereinafter, the peeling layer in this process having these advantages will be explained in detail.

(Peeling Layer)

First, the film thickness of the peeling layer is preferably in a range of 0.05 μm to 5 μm, in particular, in a range of 0.1 μm to 1 μm. By having the film thickness in the above mentioned range, the contacting area, needed for providing the function of the peeling layer peeling solution to the peeling layer, can be ensured sufficiently when the peeling layer peeling solution is brought into contact with the peeling layer.

In the present invention, the peeling layer is formed by coating the peeling layer forming coating solution, and drying. Hereinafter, the materials constituting the peeling layer forming coating solution, used when forming the peeling layer, will be explained.

(1) Peeling Material

The peeling materials for providing the peeling layer used in the present invention are not particularly limited as long as they have a high solubility to the peeling layer peeling solution used when the peeling layer is peeled off.

As the material, a polyvinyl chloride, a polyvinyl acetate, a urea resin, an acrylic resin, a polyester resin, a polycarbonate resin or the like can be presented.

Moreover, in the present invention, in the photoresist layer patterning process to be described later, there is a case that the peeling layer is patterned together with the photoresist layer, or there is a case that the peeling layer is not patterned.

For example, when the peeling layer is patterned with the photoresist layer, it is preferable that the peeling material is soluble to the photoresist developing agent used when patterning the photoresist layer. Furthermore, in the present invention, since the photoresist layer is laminated on the peeling layer, it is preferable that the peeling material is insoluble to the photoresist layer forming solvent. By using the peeling material as mentioned above, the peeling layer can be patterned with the photoresist layer, and furthermore, when coating the photoresist on the peeling layer, mixing of them can be avoided.

In contrast, in the photoresist layer patterning process to be described later, when the peeling layer is not patterned with the photoresist layer, it is preferable that the peeling material is insoluble to the photoresist developing agent. Furthermore, as mentioned above, it is preferable that it is also insoluble to the photoresist layer forming solvent. Thereby, since the peeling layer is not removed when the photoresist layer is patterned, the organic EL layer is prevented from being in contact with the photoresist developing agent. Therefore, the material selection can be widened when selecting the material of the organic EL layer since the above mentioned point is not needed to be taken into consideration.

The coating solution prepared by dissolving the materials into the suitable solvent, for each above mentioned case, can be used as the peeling layer forming coating solution.

(2) Peeling Layer Forming Solvent

In the present invention, the peeling layer forming coating solution is prepared by dissolving the peeling materials in the peeling layer forming solvent. By coating the peeling layer forming coating solution on the organic EL layer and drying, the peeling layer is formed. Therefore, as the peeling layer forming solvent, it is preferable to select a solvent having a solubility of the organic EL layer material at 25° C. and 1 atmospheric pressure of 0.001 (g/g solvent) or less, and it is further preferable to select a solvent having a solubility of 0.0001 (g/g solvent) or less.

As the peeling layer forming solvent, ketones such as an acetone, and a methyl ethyl ketone; esters such as an ethyl acetate, and a butyl acetate; a saturated hydrocarbons such as a hexane and a cyclo hexane or the like can be presented.

C. Photoresist Layer Forming Process

The photoresist layer forming process in the present invention is a process of forming a photoresist layer by coating a photoresist onto the peeling layer formed in the peeling layer forming process.

The photoresist and the photoresist layer forming solvent used in this process will be explained.

(1) Photoresist

The photoresist used in the present invention can be either a positive type or a negative time, and it is not particularly limited. However, since the organic EL layer is laminated on the photoresist layer when manufacturing an EL element having light emitting layers of a plurality of colors, one insoluble to the organic EL layer forming solvent is preferable.

As the specific photoresist to be used, a novolak resin based ones, a rubber+bisazido based ones or the like can be presented.

(2) Photoresist Layer Forming Solvent

The photoresist layer forming solvent in the present invention is used for dissolving and coating the photoresist when forming the photoresist layer. Moreover, in the present invention, since the photoresist layer is formed on the peeling layer, it is preferable that the peeling material constituting the peeling layer is insoluble to the photoresist layer forming solvent. In consideration of this point, as the photoresist layer forming solvent which can be used in the present invention, it is preferable to select a solvent having a solubility of the peeling material constituting the peeling layer at 25° C. and 1 atmospheric pressure of 0.001 (g/g solvent) or less, and it is further preferable to select a solvent having a solubility of 0.0001 (g/g solvent) or less.

Furthermore, when the buffer layer is provided as the organic EL layer, as the photoresist layer forming solvent usable in a case where the buffer layer forming material is dissolved in a water based solvent and the light emitting layer is dissolved in a non-polarity organic solvent such as an aromatic based ones or the like: ketones such as an acetone, and a methyl ethyl ketone; cellosolve acetates such as a propylene glycol monoethyl ether acetate, a propylene glycol-mono methyl ether acetate, an ethylene glycol monomethyl ether acetate, and an ethylene glycol monoethyl ether acetate; cellosolves such as a propylene glycol monoethyl ether, a propylene glycol monomethyl ether, an ethylene glycol monomethyl ether, and an ethylene glycol monoethyl ether; alcohols such as a methanol, an ethanol, a 1-butanol, a 2-butanol, and a cyclohexanol; ester based solvents such as an ethyl acetate, and a butyl acetate; a cyclohexane, a decaline or the like can be presented. A solvent other than the above can also be used as long as it satisfies the conditions, and a solvent mixture of two or more kinds can be used as well.

D. Photoresist Layer Patterning Process

The photoresist layer patterning process in the present invention is a process of patterning the photoresist layer in a desired pattern by developing with the photoresist developing agent and cleaning after pattern irradiation of an ultraviolet ray to the photoresist layer.

Hereinafter, the photoresist developing agent used in this process will be explained.

(Photoresist Developing Agent)

The photoresist developing agent in the present invention is used when forming the photoresist layer in a pattern. The photoresist developing agent is not particularly limited as long as it develops the photoresist. Specifically, an organic alkaline based developing agent commonly used can be used. In addition thereto, an inorganic alkaline or an aqueous solution capable of developing the resist can be used. It is preferable to clean with water after developing the photoresist layer.

Moreover, in this process, as mentioned above, there is a case where the peeling layer is patterned together with the photoresist layer, or a case where the peeling layer is not patterned.

First, as the photoresist developing agent in the case of patterning the peeling layer with the photoresist layer, it is preferable that the peeling layer is soluble and the organic EL layer is insoluble. Since the organic EL layer is brought into contact with the photoresist developing agent after patterning the peeling layer with the photoresist layer, a trouble of swelling or eluting of the organic EL layer at the time can be avoided.

As such a developing agent, a developing agent having a solubility of the material constituting the light emitting layer at 25° C. and 1 atmospheric pressure of 0.001 (g/g developing agent) or less is preferable, and it is further preferable to select a developing agent having a solubility of 0.0001 (g/g developing agent) or less.

In contrast, when the peeling layer is not patterned with the photoresist, a photoresist developing agent, that the peeling layer is insoluble to, is preferable. As the photoresist developing agent, a developing agent having a solubility of the material constituting the peeling layer at 25° C. and 1 atmospheric pressure of 0.001 (g/g developing agent) or less is preferable, and it is further preferable to select a developing agent having a solubility of 0.0001 (g/g developing agent) or less.

E. Organic EL Layer Developing Process

Next, the organic EL layer developing process will be explained.

The organic EL layer developing process in the present invention is a process of forming the organic EL layer in a pattern with the photoresist layer formed in a pattern provided as a mask.

As the method for forming the organic EL layer in a pattern as mentioned above, a wet method of using the solvent for dissolving the organic EL layer, and a dry method of using the dry etching can be used. Hereinafter, each method will be explained.

(Wet Method)

The wet method in this case is a method of dissolving and removing the organic EL layer by using a solvent capable of dissolving or peeling off the organic EL layer without peeling off the photoresist.

In the present invention, in the photoresist layer patterning process, there is the case of patterning the peeling layer with the photoresist layer, and the case of not patterning.

First, the case of removing the peeling layer in the photoresist layer patterning process will be explained. In this case, by using a solvent capable of dissolving or peeling off the organic EL layer without dissolving the peeling layer, the organic EL layer can be formed in a pattern.

As the solvent usable in this case, the solvents for the organic EL layer can be used, and in addition thereto, other solvents can be selected as long as it is a solvent capable of satisfying the conditions.

In contrast, when the peeling layer is not patterned with the photoresist layer in the photoresist layer patterning process, by using a solvent capable of dissolving or peeling off both the peeling layer and the organic EL layer, the peeling layer and the organic EL layer can be removed in a pattern at the same time.

Furthermore, a method, of removing the organic EL layer in a pattern by using a solvent capable of dissolving or peeling off the organic EL layer without dissolving the peeling layer after removing the peeling layer with a solvent capable of dissolving or peeling off the peeling layer, may be used as well.

(Dry Method)

The dry method is a method of etching the organic EL layer or the peeling layer, which is bared by removing the photoresist layer, by the dry etching with using the photoresist layer formed in a pattern as the mask.

Since the photoresist layer is generally formed considerably thicker than the organic EL layer or the peeling layer, the organic EL layer or the peeling layer can be removed by dry etching for the entirety.

In this case, the film thickness of the photoresist layer is preferably in a range of 0.1 to 10 μm, and further preferably in a range of 0.5 to 5 μm.

When the film thickness is in the above mentioned range, both the peeling layer and the organic EL layer can be formed in a pattern at the same time without damaging the substrate or the like.

As such dry etching method, it is preferable that the dry etching is a reactive ion etching. By using the reactive ion etching, the organic layer such as the peeling layer and the organic EL layer is reacted chemically so as to become a compound having a small molecular weight so that it can be removed from the substrate by vaporization and evaporation. And thus, a process with high etching accuracy can be enabled in a short time.

Moreover, it is preferable to use oxygen itself or a gas containing oxygen when the dry etching is carried out. By using the oxygen itself or the gas containing oxygen, decomposition and removing of the peeling layer or the organic EL layer by the oxidation reaction is possible. Therefore, the unnecessary part of the peeling layer or the organic EL layer can be removed from the substrate, and thus, a process with high etching accuracy can be enabled in a short time. Moreover, under these conditions, since the ordinarily used oxide transparent conductive film, such as an ITO, is not etched, it is also effective in that the electrode surface can be purified without deteriorating the electrode property.

Furthermore, in the present invention, it is preferable to use the atmospheric pressure plasma for the etching. By using the atmospheric pressure plasma, the dry etching, which in general requires vacuum equipment, can be carried out under the atmospheric pressure so that shortening of the processing time and lowering of the cost can be achieved. In this case, etching can be carried out by utilizing the oxidation and decomposition of the organic substance by the oxygen as the plasma in the atmosphere. However, the gas composition in the reaction atmosphere can be adjusted optionally by substitution and circulation of the gas.

In the present invention, since the peeling layer formed on the light emitting part may also be peeled off depending on the solvent, when the wet method is used, a method of developing the organic EL layer by the dry etching without the risk is preferable.

F. Peeling Layer Peeling Process

Next, the peeling layer peeling process will be explained.

The peeling layer peeling process in the present invention is a process of peeling off the peeling layer provided on the organic EL layer.

This process is a process of peeling off the peeling layer, and at this time, the unnecessary layers laminated on the peeling layer, such as the photoresist layer, are removed together with the peeling layer. Therefore, the photoresist layer, which has hardly been peeled off conventionally, can be peeled off easily by providing the peeling layer so that an EL element with little damage of the substrate or the like can be provided, and thus it is advantageous.

The peeling layer peeling solution used when peeling off the peeling layer in this process will be explained.

(Peeling Layer Peeling Solution)

As the peeling layer peeling solution used when peeling off the peeling layer, it is not particularly limited as long as it can dissolve the peeling layer without dissolving the organic EL layer formed in a pattern. For example, the above mentioned peeling layer forming solvents can be used as they are. In addition thereto, those capable of satisfying the conditions can be used as well.

As the peeling layer peeling solution, a peeling layer peeling solution having a solubility of the peeling material constituting the peeling layer at 25° C. and 1 atmospheric pressure of 0.001 (g/g peeling layer solution) or more is preferable, and it is further preferable to select a developing agent having a solubility of 0.01 (g/g peeling layer peeling solution) or more.

II. Method for Manufacturing the EL Element Having Light Emitting Layers of a Plurality of Colors In the present invention, an organic EL layer having at least a light emitting layer of one color can be manufactured by carrying out the above mentioned processes.

Furthermore, it is also possible to manufacture an EL element having light emitting layers of a plurality of colors by repeating the processes by a plurality of times. So, as an example of the method for manufacturing an EL element having the light emitting layers of a plurality of colors, the case with light emitting layers of three colors will be explained.

As the method for manufacturing an EL element having light emitting layers of three colors, one comprising: a first light emitting layer forming process of forming a first light emitting layer by coating a first light emitting layer forming coating solution on a substrate on which at least an electrode layer is formed in a pattern; a first peeling layer forming process of forming a first peeling layer by coating a first peeling layer forming coating solution on the first light emitting layer; a first photoresist layer forming process of forming a first photoresist layer by coating a photoresist on the first peeling layer; a first photoresist layer patterning process of patterning, by exposing and developing the first photoresist layer, so that the first photoresist layer remains only in an area where the first light emitting part will be formed; a first light emitting layer developing process of removing the first light emitting layer in a part where the first photoresist layer is removed; a second light emitting layer forming process of forming a second light emitting layer by coating a second light emitting layer forming coating solution on a substrate on which at least the first light emitting part, formed by laminating the first peeling layer and the first photoresist layer in this order, on the surface; a second peeling layer forming process of forming a second peeling layer by coating a second peeling layer forming coating solution on the second light emitting layer; a second photoresist layer forming process of forming a second photoresist layer by coating a photoresist on the second peeling layer; a second photoresist layer patterning process of patterning, by exposing and developing the second photoresist layer, so that the second photoresist layer remains at least in an area where the second light emitting part will be formed; a second light emitting layer developing process of removing the second light emitting layer in a part where the second photoresist layer is removed; a third light emitting layer forming process of forming a third light emitting layer by coating a third light emitting layer forming coating solution on a substrate on which at least the first light emitting part and the second peeling layer; a third peeling layer forming process of forming a third peeling layer by coating a third peeling layer forming coating solution on the third light emitting layer; a third photoresist layer forming process of forming a third photoresist layer by coating a photoresist on the second peeling layer; a third photoresist layer patterning process of patterning, by exposing and developing the third photoresist layer, so that the third photoresist layer remains at least in an area where the third light emitting part will be formed; a third light emitting layer developing process of removing the third light emitting layer in a part where the third photoresist layer is removed; can be presented.

Moreover, in the present invention, the "light emitting layer" means a layer formed by coating a light emitting layer forming coating solution and drying, and the "light emitting part" means the light emitting layer formed in a predetermined position.

By the above mentioned method for manufacturing, an EL element having light emitting parts of three colors can be manufactured. Moreover, also in this case, each peeling layer having excellent peeling property can be peeled off easily by carrying out the peeling layer peeling process when the unnecessary layers, such as the photoresist layer, is finally removed. Therefore, each photoresist layer disposed on each peeling layer can be peeled off easily at the same time with each peeling layer.

The method for manufacturing an EL element having the light emitting parts of three colors can be divided roughly into two embodiments depending on the exposing position when each light emitting layer is patterned.

Hereinafter, the method for manufacturing an EL element having the light emitting parts of three colors will be explained in detail for both embodiments.

(1) First Embodiment

The first embodiment is an embodiment of patterning each light emitting part such that a light emitting part having a color different from the light emitting part is not laminated on each light emitting part when the patterning of each light emitting part is completed.

FIGS. 1A to 1M show an example of the method for manufacturing an EL element of the first embodiment. Hereinafter, FIGS. 1A to 1M will be explained specifically.

Figure 1A:
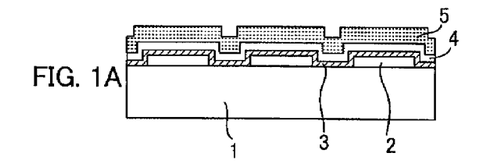
FIGS. 1A to 1M are a process diagrams showing an example of a method for manufacturing an EL element of the present invention.

First, as shown in FIG. 1A, a first light emitting layer forming coating solution is coated on a substrate 1 having an electrode 2 formed in a pattern, so as to form a first light emitting layer 3 (first light emitting layer forming process). A peeling layer forming coating solution is coated on the first light emitting layer 3 so as to form a first peeling layer 4 (first peeling layer forming process). And furthermore, a positive type photoresist is coated on the first peeling layer 4 so as to form a first photoresist layer 5 (first photoresist layer forming process).

Figure 1B:
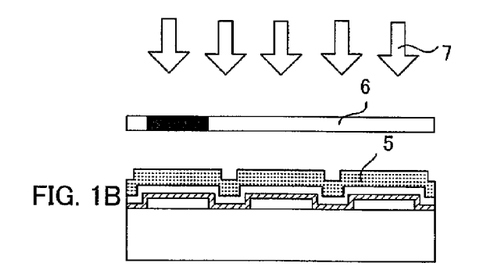
Figure 1C:
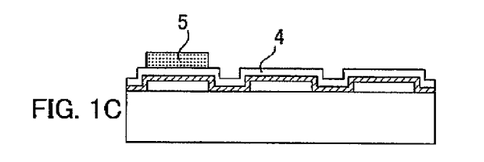

Next, as shown in FIG. 1B, an ultraviolet ray 7 is exposed in a pattern via a mask 6 such that the first photoresist layer 5 of the part where the first light emitting part is formed will an unexposed part. Thereafter, by developing the first photoresist layer 5 with a photoresist developing agent and cleaning, as shown in FIG. 1C, the first photoresist layer 5 remains only in a part where the first light emitting part will be formed (first photoresist layer patterning process). When the photoresist developing agent capable of dissolving the first peeling layer 4 is used, the first peeling layer 4 is also patterned like the first photoresist layer 5 in the first photoresist layer patterning process.

Figure 1D:
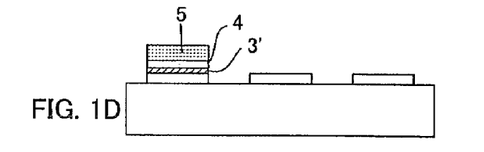

Furthermore, by etching by dry etching using the first photoresist layer 5, formed in a pattern, as the mask, as shown in FIG. 1D, a first light emitting part 3', which is the first light emitting layer 3 formed in a pattern, is obtained (first light emitting layer developing process).

Figure 1E:
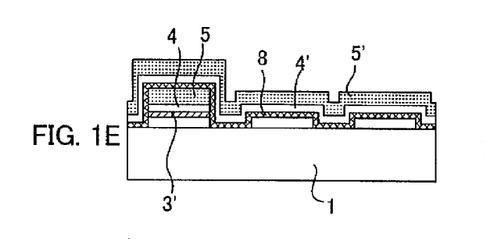

Next, as shown in FIG. 1E, a second light emitting layer forming coating solution is coated on the substrate 1, on which at least the first light emitting part 3' having the first peeling layer 4 and the first photoresist layer 5 are formed on the surface, so as to form a second light emitting layer 8 (second light emitting layer forming process). Further, a peeling layer forming coating solution is coated on the second light emitting layer 8 so as to form a second peeling layer 4' (second peeling layer forming process), and a photoresist is coated on the second peeling layer 4' so as to form a second photoresist layer 5' (second photoresist layer forming process).

Figure 1F:
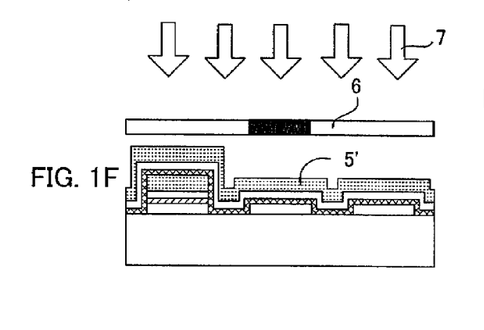
Figure 1G:
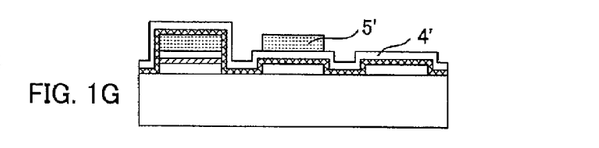

Next, as shown in FIG. 1F, the ultraviolet ray 7 is exposed in a pattern via the mask 6 such that the second photoresist layer 5' of a part, where a second light emitting part will be formed, is an unexposed part. Thereafter, by developing the second photoresist layer 5' with a photoresist developing agent and cleaning, as shown in FIG. 1G, the second photoresist layer 5' remains only in the part where the second light emitting part will be formed (second photoresist layer patterning process). As mentioned above, when the photoresist developing agent capable of dissolving the second peeling layer 4' is used, the second peeling layer 4' is also patterned like the second photoresist layer 5' in the second photoresist layer patterning process.

Figure 1H:
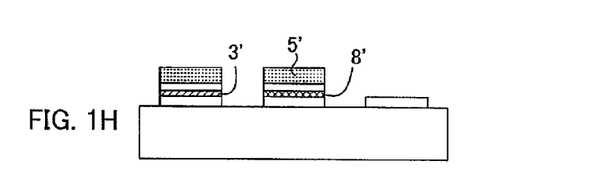

Furthermore, by etching by dry etching using the second photoresist layer 5', formed in a pattern, as the mask, as shown in FIG. 1H, a second light emitting part 8', which is the second light emitting layer 8 formed in a pattern, is obtained (second light emitting layer developing process).

Figure 1I:
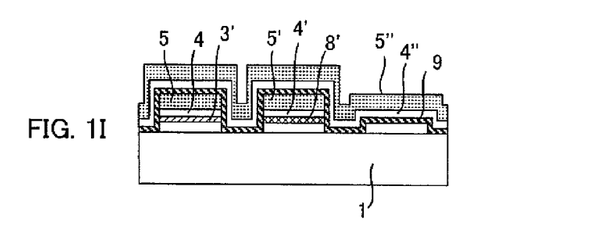

As shown in FIG. 1I, a third light emitting layer forming coating solution is coated on the substrate 1, comprising at least the first light emitting part 3' having the first peeling layer 4 and the first photoresist layer 5 laminated in this order on the surface, and the second light emitting part 8' having the second peeling layer 4' and the second photoresist layer 5' similarly laminated in this order on the surface, so as to form a third light emitting layer 9 (third light emitting layer forming process). Furthermore, a peeling layer forming coating solution is coated on the third light emitting layer 9 so as to form a third peeling layer 4" (third peeling layer forming process). And a positive type photoresist is coated on the third peeling layer 4" so as to form a third photoresist layer 5" (third photoresist layer forming process).

Figure 1J:
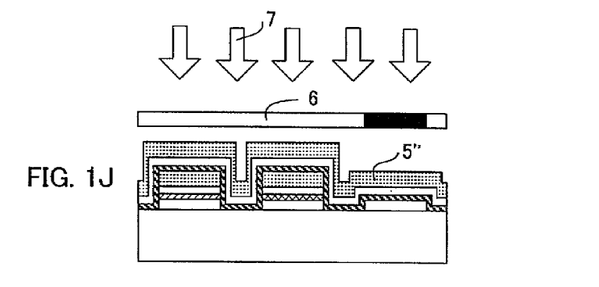
Figure 1K:
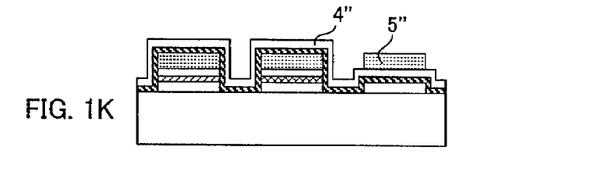

Next, as shown in FIG. 1J, the ultraviolet ray 7 is exposed in a pattern via the mask 6 such that the third photoresist layer 5" of a part, where the third light emitting part will be formed, is an unexposed part. Thereafter, by developing the third photoresist layer 5" with a photoresist developing agent and cleaning, as shown in FIG. 1N, the third photoresist layer 5" remains only in the part where the third light emitting part will be formed (third photoresist layer patterning process). As mentioned above, when the photoresist developing agent capable of dissolving the third peeling layer 4" is used, the third peeling layer 4" is also patterned like the third photoresist layer 5" in the third photoresist layer patterning process.

Figure 1L:
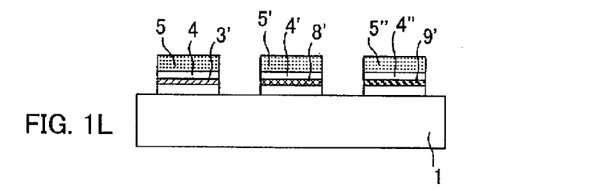

Furthermore, by etching by dry etching using the third photoresist layer 5', formed in a pattern, as the mask, as shown in FIG. 1L, a third light emitting part 9', which is the third light emitting layer 9 formed in a pattern, is obtained (third light emitting layer developing process).

Figure 1M:
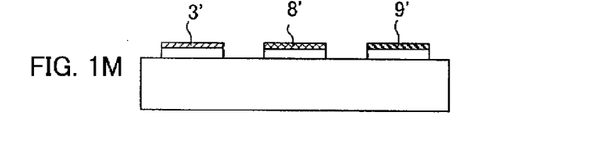

Here, by soaking the substrate 1, on which the light emitting parts 3', 8' and 9' are formed, in a peeling layer peeling solution, the peeling layers 4, 4' and 4" are peeled off so that the photoresist layers 5, 5' and 5" laminated on the peeling layers 4, 4' and 4" are removed together with the peeling layers 4, 4' and 4" (peeling layer peeling process). Thereby, as shown in FIG. 1M, the light emitting parts 3', 8' and 9' are bared. Thereafter, by forming the second electrode layer or the like, an EL element, which emits a light beam to the downward direction in the figure, can be manufactured.

The first embodiment having at least each above mentioned process will be explained.

The first light emitting layer forming process, the second light emitting layer forming process and the third light emitting layer forming process in this embodiment are processes for forming each light emitting layer by coating each light emitting layer forming coating solution and drying. Concerning these processes, since it is the same as disclosed in the above mentioned "I. Method for manufacturing the EL element, A. Organic EL layer forming process", explanation here is omitted.

Next, the first peeling layer forming process, the second peeling layer forming process and the third peeling layer forming process in this embodiment are processes for forming each peeling layer by coating a peeling layer forming coating solution. As to these processes, since it is the same as disclosed in the above mentioned "I. Method for manufacturing the EL element, B. Peeling layer forming process", explanation here is omitted.

Further, as to the first photoresist layer forming process, the second photoresist layer forming process and the third photoresist layer forming process in this embodiment, since it is the same as disclosed in the above mentioned "I. Method for manufacturing the EL element, C. Photoresist layer forming process", explanation here is omitted.

Moreover, in the first photoresist layer patterning process, the second photoresist layer patterning process and the third photoresist layer patterning process in this embodiment, each ultraviolet ray exposing position differs. For example, in the first photoresist layer patterning process, the ultraviolet ray is irradiated such that the first photoresist layer remains only in the part where the first light emitting part will be formed. Furthermore, in the second photoresist layer patterning process, the ultraviolet ray is exposed in a pattern such that the second photoresist layer remains only in the part, where the second light emitting part will be formed, and in the third photoresist layer patterning process, the ultraviolet ray is exposed in a pattern such that the third photoresist layer remains only in the part where the third light emitting part will be formed.

By the pattern irradiation of the ultraviolet ray to each part, when the patterning of each light emitting layer is completed, since the light emitting layer exhibiting different colors is not laminated on each light emitting part, a state, which minimum unnecessary layers are formed, can be obtained. Therefore, in the peeling layer peeling process, the peeling layer can be peeled off further easily so that the unnecessary layers such as the photoresist layer can be peeled off more easily.

Other things concerning these processes, since it is the same as disclosed in the above mentioned "I. Method for manufacturing the EL element, D. Photoresist patterning process", explanation here is omitted.

Next, as to the first light emitting layer developing process, the second light emitting layer developing process and the third light emitting layer developing process in this embodiment, since it is the same as disclosed in the above mentioned "I. Method for manufacturing the EL element, E. Organic EL layer developing process", explanation here is omitted.

Moreover, in the peeling layer peeling process in this embodiment, it is a process of peeling off the peeling layer formed on each light emitting part by bringing into contact with the peeling layer peeling solution.

In this embodiment, since a light emitting layer of a different color from that of each light emitting part is not formed on each light emitting part, and only one photoresist layer is laminated, there is an advantage that the peeling layer can be peeled off further easily so that the unnecessary layers such as the photoresist layer can be peeled off more easily.

Other things concerning these processes, since it is the same as disclosed in the above mentioned "I. Method for manufacturing the EL element, F. Peeling layer peeling process", explanation here is omitted.

(1) Second Embodiment

The second embodiment is an embodiment of exposing an ultraviolet ray via a mask, in the pattern irradiation carried out when patterning each three color of light emitting layers, such that a photoresist layer disposed on an area where the light emitting part, which is a subject to be patterned, will be formed and on the light emitting part already formed in a pattern remains.

That is, when patterning the second light emitting layer, the pattern irradiation is carried out such that the photoresist layer remains on the area, where the second light emitting part will be formed, and on the first light emitting part already formed in a pattern.

FIGS. 2A to 2M show an example of the method for manufacturing an EL element of such second embodiment. Hereinafter, FIGS. 2A to 2M will be explained specifically.

Figure 2A:
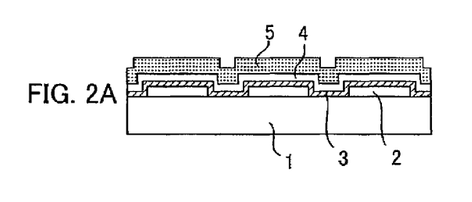
FIGS. 2A to 2M are a process diagrams showing another example of a method for manufacturing an EL element of the present invention.

First, as shown in FIG. 2A, a first light emitting layer forming coating solution is coated on a substrate 1, having an electrode 2 formed in a pattern, so as to form a first light emitting layer 3 (first light emitting layer forming process). A peeling layer forming coating solution is coated on the first light emitting layer 3 so as to form a first peeling layer 4 (first peeling layer forming process). And furthermore, a positive type photoresist is coated on the first peeling layer 4 so as to form a first photoresist layer 5 (first photoresist layer forming process).

Figure 2B:
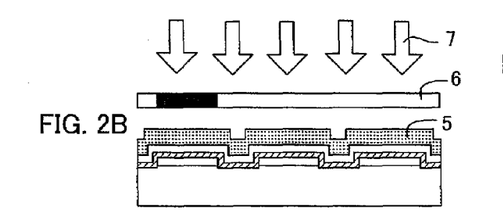
Figure 2C:
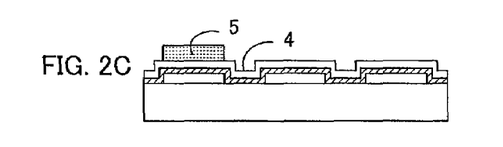

Next, as shown in FIG. 2B, an ultraviolet ray 7 is exposed in a pattern via a mask 6 such that the first photoresist layer 5, of a part where the first light emitting part will be formed, is an unexposed part. Thereafter, by developing the first photoresist layer 5 with a photoresist developing agent and cleaning, as shown in FIG. 2C, the first photoresist layer 5 remains only on the part where the first light emitting part will be formed (first photoresist layer patterning process). When the photoresist developing agent capable of dissolving the first peeling layer 4 is used, the first peeling layer 4 is also patterned like the first photoresist layer 5 in the first photoresist layer patterning process.

Figure 2D:
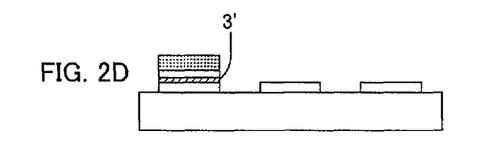

Furthermore, by etching by dry etching using the first photoresist layer 5, formed in a pattern, as the mask, as shown in FIG. 2D, a first light emitting part 3', which is the first light emitting layer 3 formed in a pattern, is obtained (first light emitting layer developing process).

Figure 2E:
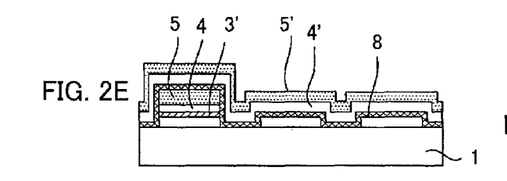

Next, as shown in FIG. 2E, a second light emitting layer forming coating solution is coated on the substrate 1, on which at least the first light emitting part 3' having the first peeling layer 4 and the first photoresist layer 5 is formed on the surface, so as to form a second light emitting layer 8 (second light emitting layer forming process). Furthermore, a peeling layer forming coating solution is coated on the second light emitting layer 8 so as to form a second peeling layer 4' (second peeling layer forming process). And a photoresist is coated on the second peeling layer 4' so as to form a second photoresist layer 5' (second photoresist layer forming process).

Figure 2F:
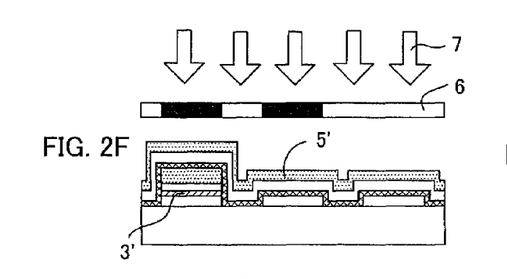
Figure 2G:
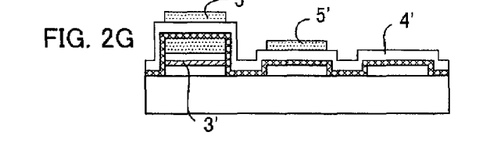

Next, as shown in FIG. 2F, the ultraviolet ray 7 is exposed in a pattern via the mask 6 such that the second photoresist layer 5' in a part, where the second light emitting part will be formed, and in the area, where the first light emitting part 3' is formed, are unexposed parts. Thereafter, by developing the second photoresist layer 5' with a photoresist developing agent and cleaning, as shown in FIG. 2G, the second photoresist layer 5' remains only on the part where the second light emitting part and the first light emitting part 3' will be formed (second photoresist layer patterning process). As mentioned above, when the photoresist developing agent capable of dissolving the second peeling layer 4' is used, the second peeling layer 4' is also patterned like the second photoresist layer 5' in the second photoresist layer patterning process.

Figure 2H:
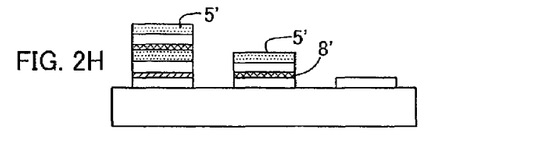

Furthermore, by etching by dry etching using the second photoresist layer 5', formed in a pattern, as the mask, as shown in FIG. 2H, a second light emitting part 8', which is the second light emitting layer 8 formed in a pattern, is obtained (second light emitting layer developing process).

Figure 2I:
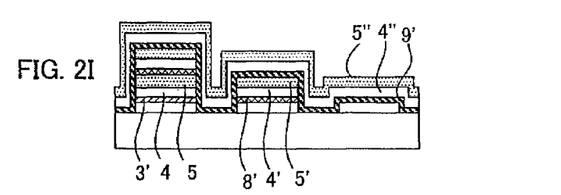

As shown in FIG. 2I, a third light emitting layer forming coating solution is coated on the substrate 1, comprising at least the first light emitting part 3' having at least the first peeling layer 4 and the first photoresist layer 5 laminated in this order on the surface, and the second light emitting part 8' having the second peeling layer 4' and the second photoresist layer 5' similarly laminated in this order on the surface, so as to form a third light emitting layer 9 (third light emitting layer forming process). Furthermore, a peeling layer forming coating solution is coated on the third light emitting layer 9 so as to form a third peeling layer 4" (third peeling layer forming process). And a photoresist is coated on the third peeling layer 4" so as to form a third photoresist layer 5" (third photoresist layer forming process).

Figure 2J:
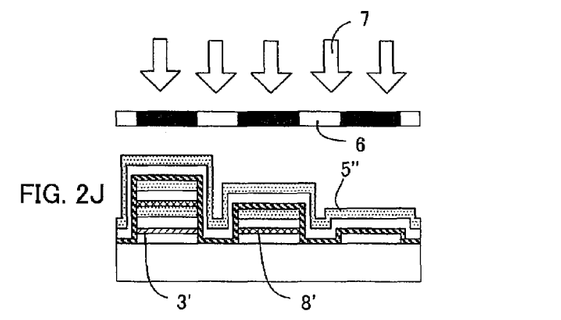
Figure 2K:
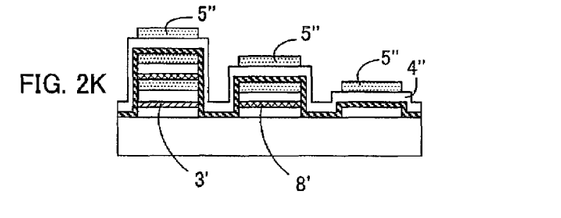

Next, as shown in FIG. 2J, the ultraviolet ray 7 is exposed in a pattern via the mask 6 such that the third photoresist layer 5" in a part, where the first light emitting part 3', the second light emitting part 8' and the third light emitting part will be formed, is an unexposed part. By developing the third photoresist layer 5" irradiated in a pattern with a photoresist developing agent and cleaning, as shown in FIG. 2K, the third photoresist layer 5" remains only in the part where the first light emitting part 3', the second light emitting part 8' and the third light emitting part will be formed (third photoresist layer patterning process). As mentioned above, when the photoresist developing agent capable of dissolving the third peeling layer 4" is used, the third peeling layer 4" is also patterned like the third photoresist layer 5" in the third photoresist layer patterning process.

Figure 2L:
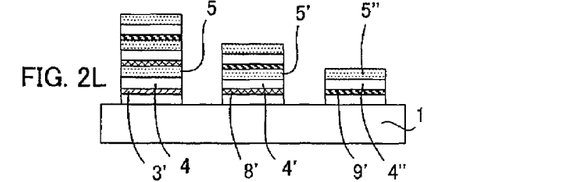

Furthermore, by etching by dry etching using the third photoresist layer 5", formed in a pattern, as the mask, as shown in FIG. 2L, a third light emitting part 9', which is the third light emitting layer 9 formed in a pattern, is obtained (third light emitting layer developing process).

Figure 2M:
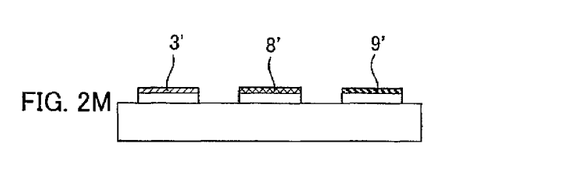

Here, by soaking the substrate 1, on which the light emitting parts 3', 8' and 9' are formed, in a peeling layer peeling solution, the peeling layers 4, 4' and 4" are peeled off so that the photoresist layers 5, 5' and 5" laminated on the peeling layers 4, 4' and 4" are removed together with the peeling layers 4, 4' and 4" (peeling layer peeling process). Thereby, as shown in FIG. 2M, the light emitting parts 3', 8' and 9' are bared. Thereafter, by forming the second electrode layer or the like, an EL element, which emits a light beam to the downward direction in the figure, can be manufactured.

In this embodiment, a light emitting layer having a different color, a photoresist layer or the like are laminated in a plurality on each light emitting part when the patterning of each light emitting layer is completed, and conventionally, it has been extremely difficult to peel off the photoresist layer in this state. This is because a plurality of unnecessary layers are laminated on the photoresist layer when finally peeling off the photoresist layer, and such a state provides a factor of restraining the function of the photoresist peeling solution, for peeling off the photoresist layer, to the photoresist layer.

However, in the present invention, since the peeling layer can be peeled off easily by the peeling layer peeling process even in such a case, a plurality of the unnecessary layers formed on the peeling layer can easily be peeled off at the same time so as to solve the problems. Hereinafter, this embodiment will be explained.

Since the first, second and third light emitting layer forming processes, the first, second and third peeling layer forming processes, the first, second and third photoresist layer forming processes, the first photoresist layer patterning process, the first, second and third light emitting layer developing processes and the peeling layer forming process in this embodiment are same as the processes in the first embodiment, explanation here is omitted.

In addition thereto, as to the second photoresist layer patterning process and the third photoresist layer patterning process, since the ultraviolet ray exposing position differs from that of the first embodiment, both processes will be explained hereinafter.

In the second photoresist layer patterning process in this embodiment, the ultraviolet ray is irradiated in a pattern such that the second photoresist layer remains also on the first light emitting part already patterned, in addition to the part, where the second light emitting part will be formed.

Thereby, when the patterning of the second light emitting layer is completed, a state, in which the second light emitting layer, the second peeling layer and the second photoresist layer are laminated on the first light emitting part, in addition to the first peeling layer and the first photoresist layer, can be provided.

Furthermore, in the third photoresist layer patterning process in this embodiment, the ultraviolet ray is exposed such that the third photoresist layer remains also on the first light emitting part already formed in a pattern and on the second light emitting part, in addition to the part where the third light emitting part will be formed.

Other things concerning the second and third photoresist layer patterning processes are the same as mentioned in the first embodiment, therefore, explanation here is omitted.

The present invention is not limited to the above mentioned embodiments. The above mentioned embodiments are examples, and anyone having the substantially same configuration and providing the same effects as the technological idea disclosed in the claims of the present invention is included in the technological scope of the present invention.

EXAMPLES

Next, with reference to the following examples, the present invention will further be explained.

Example 1

A patterned ITO substrate of a 6 inch square and 1.1 mm plate thickness was cleaned. 0.5 ml of a buffer layer coating solution (Baytron P manufactured by Bayer Yakuhin, Ltd.) was taken and dropped onto the central part of the substrate and carried out a spin coating. By maintaining at 2,500 rpm for 20 seconds, a layer was formed. As a result, the film thickness was 800 Å.

As the first light emitting layer, 1 ml of a 1 wt % xylene solution of a polyparaphenylene vinylene derivative light emitting polymer MEH-PPV was taken on the buffer layer, and dropped onto the central part of the substrate and carried out the spin coating. By maintaining at 2,000 rpm for 10 seconds, a layer was formed. As a result, the film thickness was 800 Å.

As the peeling layer, 1 ml of a 3% ethyl acetate solution of a urea based resin (Laropal manufactured by BASF) was taken and dropped onto the central part of the substrate and carried out the spin coating. By maintaining at 2,000 rpm for 20 seconds, a layer was formed. As a result, the film thickness was 1,000 Å.

1 ml of a positive type photoresist solution (manufactured by Tokyo Ohka Kogyo Co., Ltd. OFPR-800) was taken and dropped onto the central part of the substrate and carried out the spin coating. By maintaining at 2,000 rpm for 20 seconds, a layer was formed. As a result, the film thickness was about 1 µm. Pre-baking was carried out at 80° C. for 30 seconds. Thereafter, it was set on an alignment exposing machine together with an exposure mask for the ultraviolet ray exposure in the part desired to remove the light emitting layer other than the light emitting part of the first color. After developing for 20 seconds with a resist developing agent (NMD-3 manufactured by Tokyo Ohka Kogyo Co., Ltd.), it was cleaned with water for removing the photoresist layer of the exposed part.

By removing the light emitting layer, the buffer layer and the peeling layer of the part without the photoresist by dry etching, the first light emitting part was obtained.

As the second buffer layer, like the above mentioned buffer layer, 0.5 ml of a buffer layer coating solution (Baytron P manufactured by Bayer Yakuhin, Ltd.) was taken and dropped onto the central part of the substrate and carried out the spin coating. By maintaining at 2,500 rpm for 20 seconds, a layer was formed. As a result, the film thickness was 800 Å.

As the second light emitting layer, 1 ml of a 1 wt % xylene solution of a polyparaphenylene vinylene derivative light emitting polymer MEH-PPV was taken, and dropped onto the central part of the substrate and carried out the spin coating. By maintaining at 2,000 rpm for 10 seconds, a layer was formed. As a result, the film thickness was 800 Å.

As the second peeling layer, 1 ml of a 3% ethyl acetate solution of a urea based resin (Laropal manufactured by BASF) was taken and dropped onto the central part of the substrate and carried out the spin coating. By maintaining at 2,000 rpm for 20 seconds, a layer was formed. As a result, the film thickness was 1,000 Å.

1 ml of a positive type photoresist solution (OFPR-800 manufactured by Tokyo Ohka Kogyo Co., Ltd.) was taken and dropped onto the central part of the substrate and carried out the spin coating. By maintaining at 2,000 rpm for 20 seconds, a layer was formed. As a result, the film thickness was about 1 Mm. Pre-baking was carried out at 80° C. for 30 seconds. Thereafter, it was set on an alignment exposing machine together with an exposure mask for the ultraviolet ray exposure in the part desired to remove the light emitting layer other than the light emitting part of the first color. After developing for 20 seconds with a resist developing agent (NMD-3 manufactured by Tokyo Ohka Kogyo Co., Ltd.), it was cleaned with water for removing the photoresist layer of the exposed part.

By removing the light emitting layer, the buffer layer and the peeling layer of the part other than the first and second light emitting parts, by dry etching, the second light emitting part was obtained.

As the third buffer layer, like the above mentioned buffer layer, 0.5 ml of a buffer layer coating solution (Baytron P manufactured by Bayer Yakuhin, Ltd.) was taken and dropped onto the central part of the substrate and carried out the spin coating. By maintaining at 2,500 rpm for 20 seconds, a layer was formed. As a result, the film thickness was 800 Å.

As the third peeling layer, 1 ml of a 3% ethyl acetate solution of a urea based resin (Laropal manufactured by BASF) was taken and dropped onto the central part of the substrate and carried out the spin coating. By maintaining at 2,000 rpm for 20 seconds, a layer was formed. As a result, the film thickness was 1,000 Å.

As the third light emitting layer, 1 ml of a 1 wt % xylene solution of a polyparaphenylene vinylene derivative light emitting polymer MEH-PPV was taken, and dropped onto the central part of the substrate and carried out the spin coating. By maintaining at 2,000 rpm for 10 seconds, a layer was formed. As a result, the film thickness was 800 Å.

1 ml of a positive type photoresist solution (OFPR-800 manufactured by Tokyo Ohka Kogyo Co., Ltd.) was taken and dropped onto the substrate central part and carried out the spin coating. By maintaining at 2,000 rpm for 20 seconds, a layer was formed. As a result, the film thickness was about 1 µm. Pre-baking was carried out at 80° C. for 30 seconds. Thereafter, it was set on an alignment exposing machine together with an exposure mask for the ultraviolet ray exposure in the part desired to remove the light emitting layer other than the light emitting part of the first color. After developing for 20 seconds with a resist developing agent (NMD-3 manufactured by Tokyo Ohka Kogyo Co., Ltd.), it was cleaned with water for removing the photoresist layer of the exposed part.

By removing the light emitting layer, the buffer layer and the peeling layer in the part other than the light emitting parts, by dry etching, the third light emitting part was obtained.

By soaking the obtained substrate in an ethyl acetate bath, all the photoresist on the light emitting layer was removed so as to bare the patterned light emitting layer.

After drying at 100° C. for 1 hour, by vapor depositing a Ca by 500 Å as a second electrode layer and furthermore, an Ag by 2,500 Å thickness as a protecting layer, on the obtained substrate, an EL element was manufactured.

With the ITO electrode side connected to the positive electrode and the Ag electrode side to the negative electrode, a direct current was applied by a source meter. Light emission was observed from the first, second and third light emitting parts respectively at the time of applying 10 V.

The invention claimed is:

1. A method for manufacturing an electroluminescent element comprising:
- a first light emitting layer forming process of forming a first light emitting layer on a substrate on which at least an electrode layer is formed in a pattern;
- a first peeling layer forming process of forming a first peeling layer on the first light emitting layer;
- a first photoresist layer forming process of forming a first photoresist layer on the first peeling layer;
- a first photoresist layer patterning process of patterning, by exposing and developing the first photoresist layer, so that the first photoresist layer remains only in an area where a first light emitting part will be formed;
- a first light emitting layer developing process of removing the first peeling layer and the first light emitting layer in a part where the first photoresist layer is removed;
- a second light emitting layer forming process of forming a second light emitting layer on a substrate on which at least the first light emitting part, formed by laminating the first light emitting layer, the first peeling layer and the first photoresist layer in this order, on a surface;
- a second peeling layer forming process of forming a second peeling layer on the second light emitting layer,
- a second photoresist layer forming process of forming a second photoresist layer on the second peeling layer;
- a second photoresist layer patterning process of patterning, by exposing and developing the second photoresist layer, so that the second photoresist layer remains at least in an area where the first light emitting part formed and an area where a second light emitting part will be formed;
- a second light emitting layer developing process of removing the second peeling layer and the second light emitting layer in a part where the second photoresist layer is removed;
- a third light emitting layer forming process of forming a third light emitting layer on a substrate on which at least the first light emitting part, formed by laminating the first light emitting layer, the first peeling layer, the first photoresist layer, the second light emitting layer, the second peeling layer and the second photoresist layer in this order, on the surface, and the second light emitting part, formed by laminating the second light emitting layer, the second peeling layer and the second photoresist layer in this order, on the surface;
- a third peeling layer forming process of forming a third peeling layer on the third light emitting layer;
- a third photoresist layer forming process of forming a third photoresist layer on the third peeling layer;
- a third photoresist layer patterning process of patterning, by exposing and developing the third photoresist layer, so that the third photoresist layer remains at least in an area where the first light emitting part and the second light emitting part formed and an area where a third light emitting part will be formed;
- a third light emitting layer developing process of removing the third peeling layer and the third light emitting layer in a part where the third photoresist layer is removed; and
- a peeling layer peeling process of removing the following by peeling off each of the peeling layer;
- the first peeling layer, the first, photoresist layer, the second light emitting layer, the second peeling layer, the second photoresist layer, the third light emitting layer, the third peeling layer and the third photoresist layer in the first light emitting part,
- the second peeling layer, the second photoresist layer, the third light emitting layer, the third peeling layer and the third photoresist layer in the second light emitting part, and
- the third peeling layer and the third photoresist layer in the third light emitting part,
- wherein each peeling material used for forming each of the peeling layer is insoluble to each photoresist layer forming solvent used for forming each of the photoresist layer, and
- a solubility of each peeling layer forming solvent used for forming each of the peeling layer to each of the light emitting layer at 25° C. and 1 atmospheric pressure is 0.001 (g/g solvent) or less.

2. The method for manufacturing an electroluminescent element according to claim 1, wherein each the peeling layer is insoluble to each photoresist layer forming solvent used for forming each the photoresist layer, and a material insoluble to each peeling layer forming solvent used for forming each the peeling layer is used for each the light emitting layer.

3. The method for manufacturing an electroluminescent element according to claim 1 or 2, wherein each of the peeling layer is insoluble to each photoresist developing agent used for developing each of the photoresist layer.

4. The method for manufacturing an electroluminescent element according to claim 1 or 2, wherein each of the peeling layer is soluble to each photoresist developing agent used for developing each of the photoresist layer, and each of the light emitting layer is insoluble to each of the photoresist developing agent.

5. The method for manufacturing an electroluminescent element according to claim 1 to 2, wherein a film thickness of each of the peeling layer is in a range of 0.05 μm to 5 μm.

6. The method for manufacturing an electroluminescent element according to claim 1 to 2, wherein each of the light emitting layer developing process is a process of using a dry etching method.

* * * * *